(12) United States Patent
Wang et al.

(10) Patent No.: US 12,460,876 B2
(45) Date of Patent: Nov. 4, 2025

(54) FIN STRUCTURE

(71) Applicant: PURPLE CLOUD DEVELOPMENT PTE. LTD., Singapore (SG)

(72) Inventors: Xue Mei Wang, Hui Zhou (CN); Xiao Min Zhang, Hui Zhou (CN); Xiong Zhang, Hui Zhou (CN)

(73) Assignee: Purple Cloud Development Pte. Ltd., Singapore (SG)

( * ) Notice: Subject to any disclaimer, the term of this patent is extended or adjusted under 35 U.S.C. 154(b) by 222 days.

(21) Appl. No.: 18/108,554

(22) Filed: Feb. 10, 2023

(65) Prior Publication Data

US 2024/0125563 A1 Apr. 18, 2024

(30) Foreign Application Priority Data

Oct. 13, 2022 (CN) .......................... 202211254456.1

(51) Int. Cl.
*F28F 7/00* (2006.01)
*F28F 3/04* (2006.01)
*F28F 21/08* (2006.01)

(52) U.S. Cl.
CPC .............. *F28F 3/04* (2013.01); *F28F 21/084* (2013.01); *F28F 21/085* (2013.01); *F28F 2275/06* (2013.01)

(58) Field of Classification Search
CPC .......... F28F 3/04; F28F 21/084; F28F 21/085; F28F 2275/06
USPC .......................................................... 165/185
See application file for complete search history.

(56) References Cited

U.S. PATENT DOCUMENTS

| | | | |
|---|---|---|---|
| 2013/0206376 A1* | 8/2013 | Shikazono | F28D 1/0316 165/172 |
| 2017/0104251 A1* | 4/2017 | Wang | H01M 10/6567 |
| 2021/0105911 A1* | 4/2021 | Yang | H05K 7/20772 |
| 2022/0418155 A1* | 12/2022 | Chen | H01L 23/427 |

\* cited by examiner

*Primary Examiner* — Davis D Hwu
(74) *Attorney, Agent, or Firm* — MERCHANT & GOULD P.C.

(57) ABSTRACT

A fin structure includes an inlet fin assembly and an outlet fin assembly. The inlet fin assembly includes a plurality of inlet fins arranged side by side, and a first air channel is formed between two of the plurality of inlet fins that are adjacent to each other. The outlet fin assembly includes a plurality of outlet fins arranged side by side, and a second air channel is formed between two of the plurality of outlet fins that are adjacent to each other. The inlet fin assembly is connected to the outlet fin assembly, and the plurality of first air channels are in fluid communication with the plurality of second air channels. A thermal conductivity of the inlet fin assembly is greater than a thermal conductivity of the outlet fin assembly.

11 Claims, 4 Drawing Sheets

FIN STRUCTURE

CROSS-REFERENCE TO RELATED APPLICATIONS

This non-provisional application claims priority under 35 U.S.C. § 119(a) on Patent Application No(s). 202211254456.1 filed in China, on Oct. 13, 2022, the entire contents of which are hereby incorporated by reference.

TECHNICAL FIELD

The present disclosure relates to a fin structure, more particularly to a fin structure made of different materials.

BACKGROUND

With the rapid development of technology, the computing performance of various electronic components has increased significantly, and more heat is generated by those electronic components. To prevent the electronic components from being damaged due to high temperature, it is necessary to install a cooling device on the electronic components to dissipate the excessive heat generated by the electronic components. A common cooling device is a fin assembly connected to a thermally conductive plate. The heat generated from the electronic components during operation is transferred to the fin assembly via the thermally conductive plate so that the temperature of the electronic components may be reduced via an airflow passing through the fin assembly.

Generally, conventional fin assembly is made of a single material such as aluminum or copper. However, if the fin assembly is made of aluminum with low thermal conductivity, the electronic component is unable to be effectively cooled. On the other hand, if the fin assembly is made of copper with a higher thermal conductivity, although the electronic component may be effectively cooled, the manufacturing cost and the weight of the fin assembly may be increased. Therefore, it is required to a fin assembly of high thermal conductivity, low cost and light weight.

SUMMARY

The present disclosure provides a fin structure, which arranges two fin assemblies made of different materials according to the flow of external cold airflow so as to allow the fin structure to meet the requirements of high cooling efficiency, low cost and light weight.

One embodiment of the present disclosure provides a fin structure including an inlet fin assembly and an outlet fin assembly. The inlet fin assembly includes a plurality of inlet fins arranged side by side, and a first air channel is formed between two of the plurality of inlet fins that are adjacent to each other. The outlet fin assembly includes a plurality of outlet fins arranged side by side, and a second air channel is formed between two of the plurality of outlet fins that are adjacent to each other. The inlet fin assembly is connected to the outlet fin assembly, and the plurality of first air channels are in fluid communication with the plurality of second air channels. A thermal conductivity of the inlet fin assembly is greater than a thermal conductivity of the outlet fin assembly.

According to the fin structure disclosed in the above embodiments, since the thermal conductivity of the inlet fin assembly is greater than the thermal conductivity of the outlet fin assembly, a heat generated by a heat source may be transferred to the inlet fin assembly rapidly and effectively so that a temperature of the inlet fin assembly is higher than a temperature of the outlet fin assembly. In addition, a cool air blew from the outside of the fin structure has not absorbed the heat from the fin structure. Therefore, the cool air with relatively low temperature exchanges heat with the inlet fin assembly with higher temperature, thereby further improving the cooling efficiency.

In addition, since the heat generated by the heat source is transferred to the inlet fin assembly rapidly and effectively, a material of the outlet fin assembly may be selected to have low thermal conductivity, low cost and light weight. Also, the thermal conductivity of the inlet fin assembly is greater than the thermal conductivity of the outlet fin assembly. Thus, the fin structure may meet the requirements of high cooling efficiency, low cost and light weight.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present disclosure. The following embodiments further illustrate various aspects of the present disclosure, but are not meant to limit the scope of the present disclosure.

Figure 1:
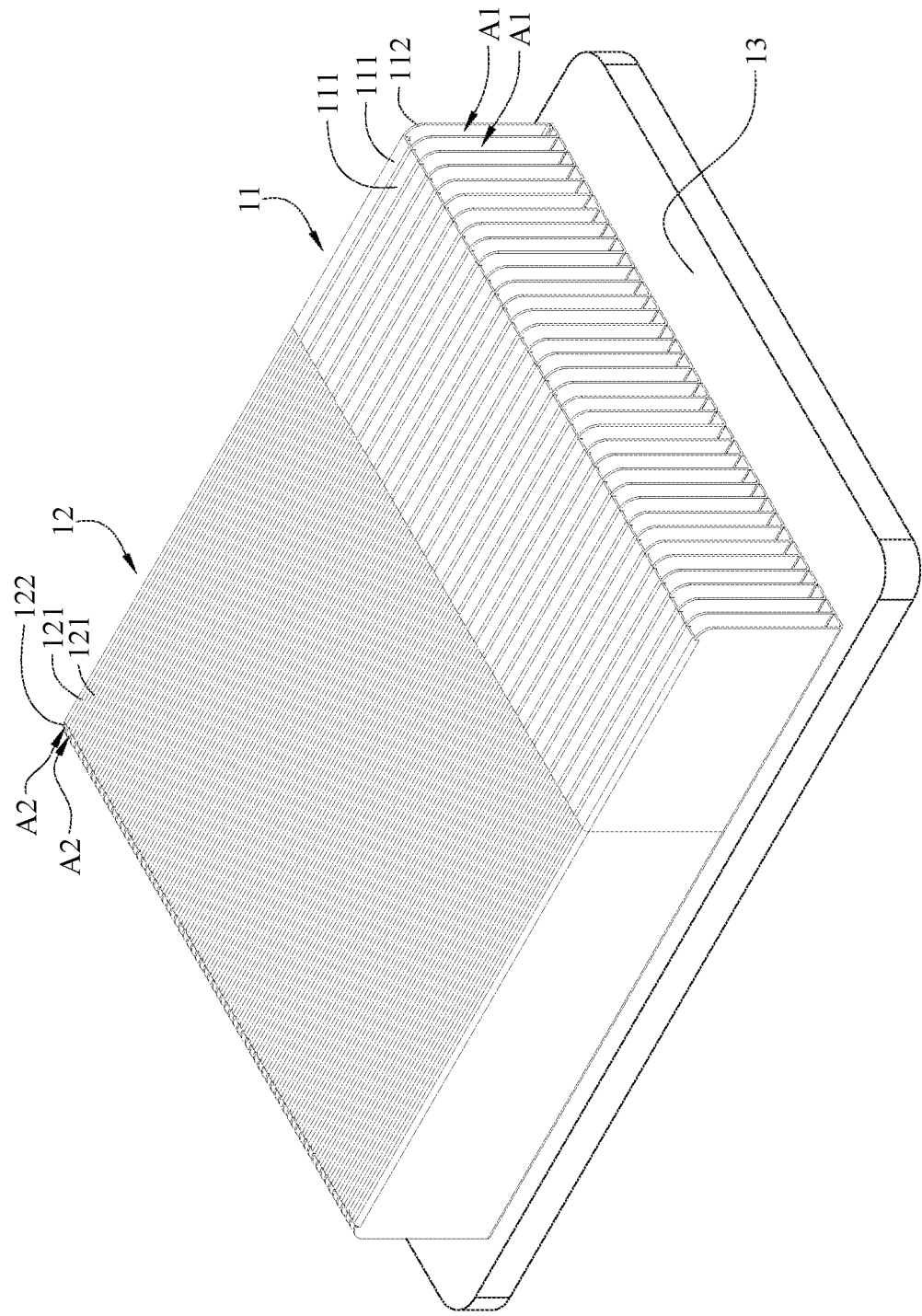
FIG. 1 is a perspective view of a fin structure in accordance with the first embodiment of the present disclosure.
Figure 2:
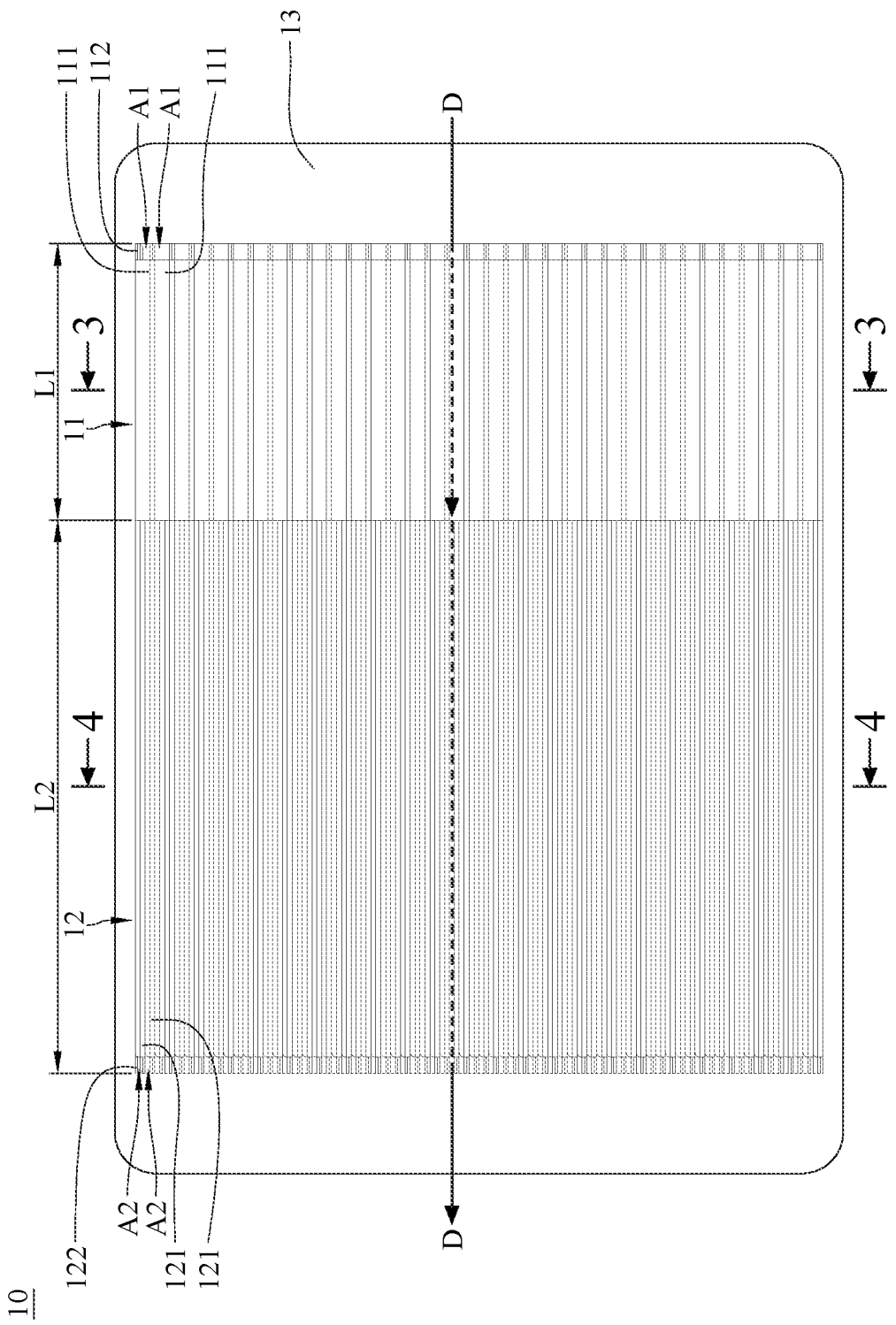
FIG. 2 is a top view of the fin structure in FIG. 1.
Figure 3:
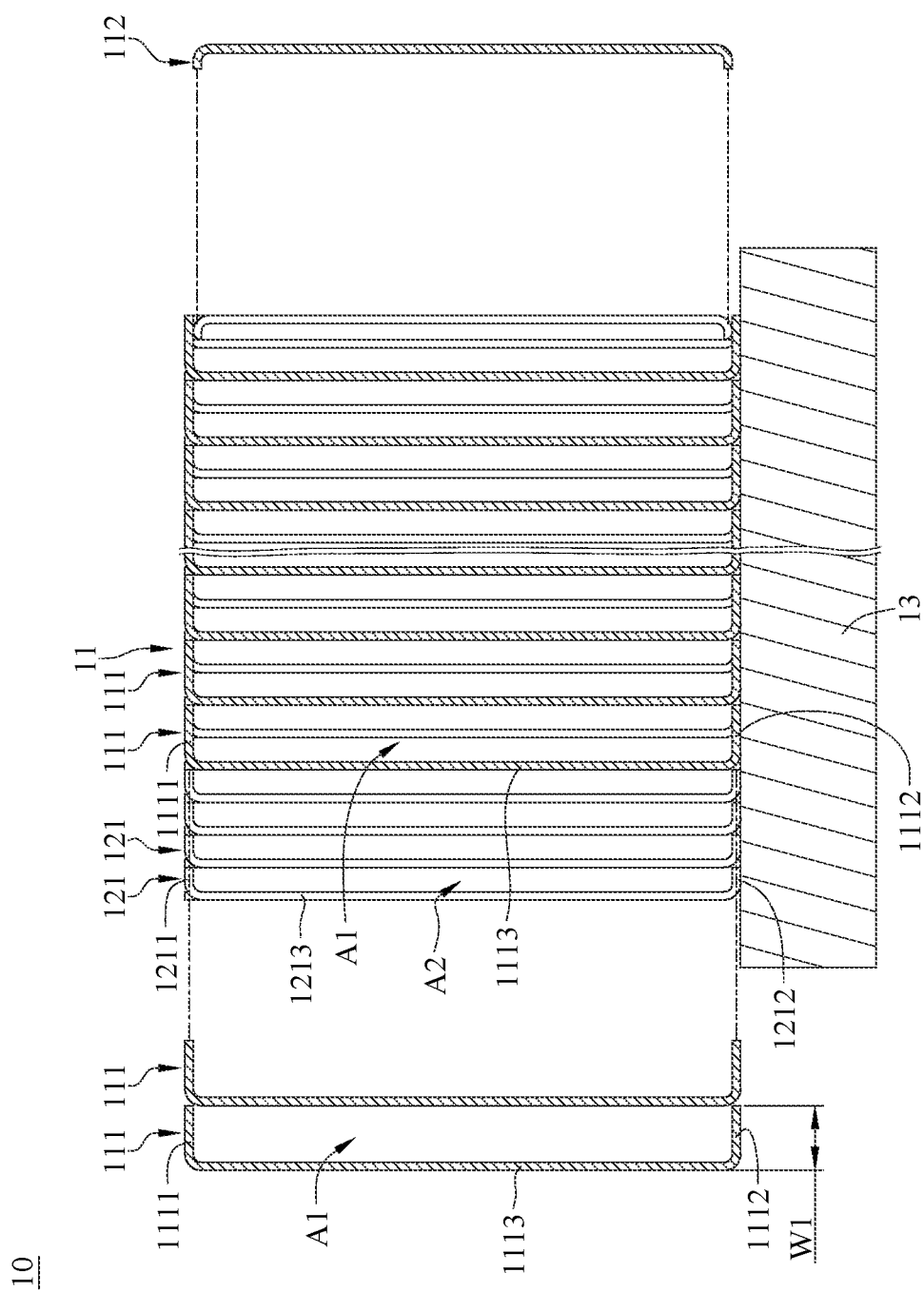
FIG. 3 is a partial exploded cross-sectional view of the fin structure taken along line 3-3 in FIG. 2.
Figure 4:
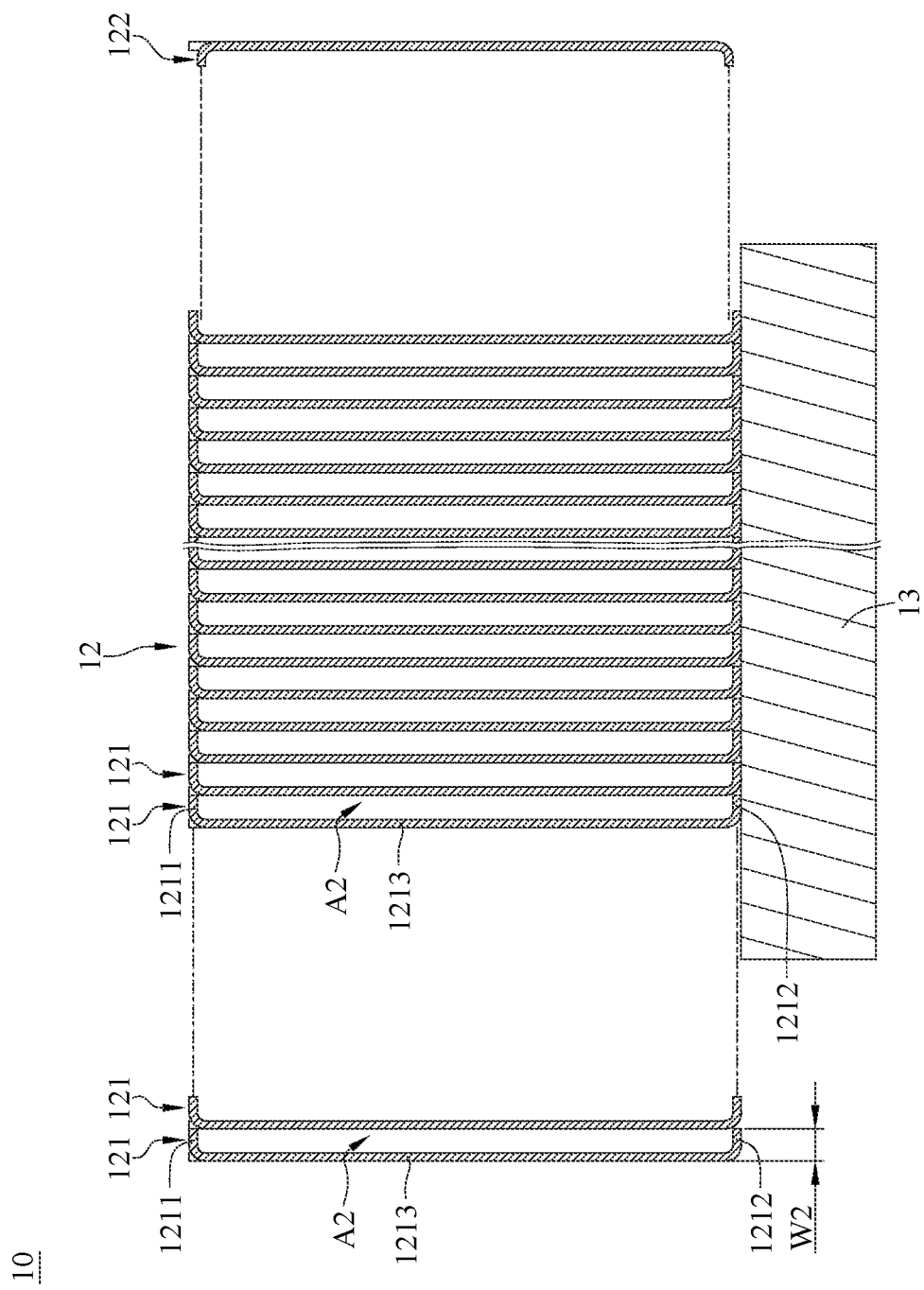
FIG. 4 is a partial exploded cross-sectional view of the fin structure taken along line 4-4 in FIG. 2.

Please refer to FIG. 1 to FIG. 4, where FIG. 1 is a perspective view of a fin structure 10 in accordance with the first embodiment of the present disclosure, FIG. 2 is a top view of the fin structure 10 in FIG. 1, FIG. 3 is a partial exploded cross-sectional view of the fin structure taken along line 3-3 in FIG. 2, and FIG. 4 is a partial exploded cross-sectional view of the fin structure taken along line 4-4 in FIG. 2.

In this embodiment, the fin structure 10 includes an inlet fin assembly 11 and an outlet fin assembly 12. The inlet fin assembly 11 includes a plurality of inlet fins 111. The plurality of inlet fins 111 are, for example, made of copper whose thermal conductivity is 401 Watts·meter$^{-1}$·Kelvin$^{-1}$ (W·m$^1$·K$^1$). Each of the inlet fin 111 includes a first top plate 1111, a first bottom plate 1112 and a first side plate 1113 connecting the first top plate 1111 and the first bottom plate 1112. The plurality of inlet fins 111 are arranged side by side, and the first top plate 1111 and the first bottom plate 1112 of one of the inlet fin 111 contact the first side plate 1113 of the another inlet fin 111 adjacent thereto. Thus, the first top plate 1111, the first bottom plate 1112 and the first side plate 1113 of one of the inlet fin 111 and the first side plate 1113 of the another inlet fin 111 adjacent thereto together form a first air channel A1.

The outlet fin assembly 12 includes a plurality of outlet fins 121. The plurality of outlet fins 121 are, for example, made of aluminum whose thermal conductivity is 237 $W \cdot m^1 \cdot K^1$. That is, the thermal conductivity of the inlet fin assembly 11 is greater than the thermal conductivity of the outlet fin assembly 12. Each of the outlet fin 121 includes a second top plate 1211, a second bottom plate 1212 and a second side plate 1213 connecting the second top plate 1211 and the second bottom plate 1212. The plurality of outlet fins 121 are arranged side by side, and the second top plate 1211 and the second bottom plate 1212 of one of the outlet fin 121 contacts the second side plate 1213 of the another outlet fin 121 adjacent thereto. Thus, the second top plate 1211, the second bottom plate 1212 and the second side plate 1213 of one of the outlet fin 121 and the second side plate 1213 of the another outlet fin 121 adjacent thereto together form a second air channel A2. The inlet fin assembly 11 contacts the outlet fin assembly 12, and the first air channels A1 are in fluid communication with the second air channels A2. Generally, an airflow generating device (not shown), for example, a fan may be provided to blow cold airflow along a direction D to cool the fin structure 10.

In this embodiment, the inlet fin assembly 11 and the outlet fin assembly 12 are made of different materials (i.e. the fin structure 10 is composed of a composite material, including the inlet fin assembly 11 and the outlet fin assembly 12), and the thermal conductivity of the inlet fin assembly 11 is greater than the thermal conductivity of the outlet fin assembly 12. Thus, a heat generated by a heat source may be transferred to the inlet fin assembly 11 rapidly and effectively so that a temperature of the inlet fin assembly 11 is higher than a temperature of the outlet fin assembly 12. In addition, since the cold airflow blew from the outside of the fin structure 10 has not absorbed the heat from the fin structure 10, the cold airflow will cool the inlet fin assembly 11 with a higher temperature prior to the outlet fin assembly 12, thereby effectively cool the fin structure 10.

In addition, since the heat generated by the heat source is transferred to the inlet fin assembly 11 rapidly and effectively, a material of the outlet fin assembly 12 may be selected to have low thermal conductivity, low cost and light weight. Also, the thermal conductivity of the inlet fin assembly 11 is greater than the thermal conductivity of the outlet fin assembly 12. Thus, the fin structure 10 may meet the requirements of high cooling efficiency, low cost and light weight.

The inlet fin assembly 11 further includes an inlet side plate 112, located at a side of the inlet fin assembly 11. The inlet side plate 112 contacts the first top plate 1111 and the first bottom plate 1112 of another inlet fin 111 adjacent thereto. The inlet side plate 112 forms a first air channel A1 together with the first top plate 1111, the first bottom plate 1112 and the first side plate 1113 of another inlet fin 111 adjacent thereto. Accordingly, the inlet side plate 112 may prevent the cold airflow from leaking out from a side of the inlet fin assembly 11.

The outlet fin assembly 12 further includes an outlet side plate 122, located at a side of the outlet fin assembly 12. The outlet side plate 122 contacts the second top plate 1211 and the second bottom plate 1212 of another outlet fin 121 adjacent thereto. The outlet side plate 122 forms a second air channel A2 together with the second top plate 1211, the second bottom plate 1212 and the second side plate 1213 of another outlet fin 121 adjacent thereto. Accordingly, the outlet side plate 122 may prevent the cold airflow from leaking out from a side of the outlet fin assembly 12.

In this embodiment, the first top plate 1111, the first bottom plate 1112 and the first side plate 1113 of each of the inlet fin 111 are integrally formed as a single piece, and are formed via sheet metal bending, but the present disclosure is not limited thereto. In other embodiments, the first top plate, the first bottom plate and the first side plate of the inlet fins may be separate plates that are fixed to one another.

In this embodiment, the second top plate 1211, the second bottom plate 1212 and the second side plate 1213 of each of the outlet fin 121 are integrally formed as a single piece, and are formed via sheet metal bending, but the present disclosure is not limited thereto. In other embodiments, the second top plate, the second bottom plate and the second side plate of the outlet fins may be separate plates that are fixed to one another.

In this embodiment, the inlet fin assembly 11 contacts the outlet fin assembly 12, but the present disclosure is not limited thereto. In other embodiments, the inlet fin assembly may be welded to the outlet fin assembly.

In this embodiment, the inlet fin 111 of the inlet fin assembly 11 has a first length L1 along an extending direction of a side connecting the first top plate 1111 and the first side plate 1113, and the outlet fin 121 of the outlet fin assembly 12 has a second length L2 along an extending direction of a side connecting the second top plate 1211 and the second side plate 1213. The first length L1 is, for example, one third to two third of the sum of the first length L1 and the second length L2. The sum of the first length L1 and the second length L2 is, for example, greater than or equal to 50 millimeters and less than or equal to 500 millimeters. Thus, the efficiency for the fin structure 10 to cool the heat source is improved.

In this embodiment, a width W1 of the first air channel A1 of the fin structure 10 is greater than or equal to a width W2 of the second air channel A2 of the fin structure 10, and the width W1 and the width W2 are, for example, greater than or equal to 0.5 millimeters and less than 5 millimeters, respectively. Thus, the efficiency for the fin structure 10 to cool the heat source is improved.

The fin structure 10 further includes a thermally conductive plate 13. The inlet fin assembly 11 and the outlet fin assembly 12 is welded on and supported by the thermally conductive plate 13. That is, the thermally conductive plate 13 is thermally coupled to the inlet fin assembly 11 and the outlet fin assembly 12. The thermally conductive plate 13 transfers heat generated by the heat source to the inlet fin assembly 11 and the outlet fin assembly 12, and the transferred heat is dissipated to the outside via the cold airflow passing through the inlet fin assembly 11 and the outlet fin assembly 12.

According to the fin structure disclosed in the above embodiments, since the thermal conductivity of the inlet fin assembly is greater than the thermal conductivity of the outlet fin assembly, a heat generated by a heat source may be transferred to the inlet fin assembly rapidly and effectively so that a temperature of the inlet fin assembly is higher than a temperature of the outlet fin assembly. In addition, a cool air blew from the outside of the fin structure has not absorbed the heat from the fin structure. Therefore, the cool air with relatively low temperature exchanges heat with the inlet fin assembly with higher temperature, thereby further improving the cooling efficiency.

In addition, since the heat generated by the heat source is transferred to the inlet fin assembly rapidly and effectively, a material of the outlet fin assembly may be selected to have low thermal conductivity, low cost and light weight. Also, the thermal conductivity of the inlet fin assembly is greater than the thermal conductivity of the outlet fin assembly. Thus, the fin structure may meet the requirements of high cooling efficiency, low cost and light weight.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A fin structure, comprising:
an inlet fin assembly, comprising:
a plurality of inlet fins, arranged side by side, wherein a first air channel is formed between two of the plurality of inlet fins that are adjacent to each other; and
an outlet fin assembly, comprising:
a plurality of outlet fins, arranged side by side, wherein a second air channel is formed between two of the plurality of outlet fins that are adjacent to each other, the inlet fin assembly is connected to the outlet fin assembly, and the plurality of first air channels are in fluid communication with the plurality of second air channels; and
wherein a thermal conductivity of the inlet fin assembly is greater than a thermal conductivity of the outlet fin assembly;
wherein the first air channel and the second air channel are configured to extend sequentially along the length of the fin structure; and wherein the inlet fins and the outlet fins are disposed adjacent to opposite ends of the fin structure, respectively.

2. The fin structure according to claim 1, wherein a width of the plurality of first air channels are greater than or equal to a width of the plurality of second air channels.

3. The fin structure according to claim 2, wherein each of the plurality of inlet fins of the inlet fin assembly comprise a first top plate, a first bottom plate and a first side plate connecting the first top plate and the first bottom plate, the first top plate, the first bottom plate and the first side plate of one of the plurality of inlet fins and the first side plate of another one of the plurality of inlet fins adjacent thereto together form the first air channel, the inlet fin of the inlet fin assembly has a first length along an extending direction of a side connecting the first top plate and the first side plate, each of the plurality of outlet fins of the outlet fin assembly comprise a second top plate, a second bottom plate and a second side plate connecting the second top plate and the second bottom plate, the second top plate, the second bottom plate and the second side plate of one of the plurality of the outlet fins and the second side plate of another one of the plurality of outlet fins adjacent thereto together form the second air channel, the outlet fin of the outlet fin assembly has a second length along an extending direction of a side connecting the second top plate and the second side plate, the first length is one third to two third of a sum of the first length and the second length.

4. The fin structure according to claim 3, wherein the sum of the first length and the second length is greater than or equal to 50 millimeters and less than or equal to 500 millimeters.

5. The fin structure according to claim 1, further comprising a thermally conductive plate supporting the inlet fin assembly and the outlet fin assembly, and transferring heat of a heat source to the inlet fin assembly and the outlet fin assembly, wherein the heat is dissipated via an airflow passing though the inlet fin assembly and the outlet fin assembly.

6. The fin structure according to claim 5, wherein the inlet fin assembly and the outlet fin assembly are welded on the thermally conductive plate.

7. The fin structure according to claim 1, wherein a width of the plurality of first air channels and a width of the plurality of second air channels are greater than or equal to 0.5 millimeters and less than or equal to 5 millimeters.

8. The fin structure according to claim 1, wherein the inlet fin assembly is made of copper.

9. The fin structure according to claim 1, wherein the outlet fin assembly is made of aluminum.

10. A fin structure, comprising:
an inlet fin assembly, comprising:
a plurality of inlet fins, arranged side by side, wherein a first air channel is formed between two of the plurality of inlet fins that are adjacent to each other; and
an outlet fin assembly, comprising:
a plurality of outlet fins, arranged side by side, wherein a second air channel is formed between two of the plurality of outlet fins that are adjacent to each other, the inlet fin assembly is connected to the outlet fin assembly, and the plurality of first air channels are in fluid communication with the plurality of second air channels; and
wherein a thermal conductivity of the inlet fin assembly is greater than a thermal conductivity of the outlet fin assembly;
wherein a width of the plurality of first air channels are greater than or equal to a width of the plurality of second air channels;
wherein each of the plurality of inlet fins of the inlet fin assembly comprise a first top plate, a first bottom plate and a first side plate connecting the first top plate and the first bottom plate, the first top plate, the first bottom plate and the first side plate of one of the plurality of inlet fins and the first side plate of another one of the plurality of inlet fins adjacent thereto together form the first air channel, the inlet fin of the inlet fin assembly has a first length along an extending direction of a side connecting the first top plate and the first side plate, each of the plurality of outlet fins of the outlet fin assembly comprise a second top plate, a second bottom plate and a second side plate connecting the second top plate and the second bottom plate, the second top plate, the second bottom plate and the second side plate of one of the plurality of the outlet fins and the second side plate of another one of the plurality of outlet fins adjacent thereto together form the second air channel, the outlet fin of the outlet fin assembly has a second length along an extending direction of a side connecting the second top plate and the second side plate, the first length is one third to two third of a sum of the first length and the second length.

11. The fin structure according to claim 10, wherein the sum of the first length and the second length is greater than or equal to 50 millimeters and less than or equal to 500 millimeters.

* * * * *